United States Patent [19]

Erwine et al.

[11] 4,077,002

[45] Feb. 28, 1978

[54] METHOD AND APPARATUS FOR NMR SAMPLE TUBE VORTEX PLUG

[75] Inventors: Barbara L. Erwine, Palo Alto; Stephen H. Smallcombe, Cupertino, both of Calif.

[73] Assignee: Varian Associates, Inc., Palo Alto, Calif.

[21] Appl. No.: 743,893

[22] Filed: Nov. 22, 1976

[51] Int. Cl.² ............................................. G01R 33/08
[52] U.S. Cl. ........................... 324/0.5 AH; 324/0.5 A
[58] Field of Search ............ 324/0.5 R, 0.5 A, 0.5 AH

[56] References Cited

U.S. PATENT DOCUMENTS

| 3,091,732 | 5/1963 | Anderson et al. | 324/0.5 AH |
| 3,911,355 | 10/1975 | Leane | 324/0.5 A |

Primary Examiner—M. Tokar
Attorney, Agent, or Firm—Stanley Z. Cole; Edward H. Berkowitz; Gerald M. Fisher

[57] ABSTRACT

A vortex restraining plug for an NMR spinning sample tube which floats partially submerged in the sample and which restrains vortexing.

10 Claims, 6 Drawing Figures

$$h_s = h_o - \frac{\omega^2 R^2}{4g} + \frac{\omega^2 r^2}{2g}$$

$$h_p = h_o - \frac{\omega^2}{4g}(R^2 - P^2)$$

METHOD AND APPARATUS FOR NMR SAMPLE TUBE VORTEX PLUG

BACKGROUND OF THE INVENTION

In order to examine a liquid sample in an NMR spectrometer, in the majority of cases, the liquid is inserted into an elongated narrow tube which is is placed in the strong magnetic field of the spectrometer. In high resolution spectroscopy, in order to average out the effects of inhomogeneities in the magnetic field the sample tube is caused to spin about its axis while mounted in a spinner apparatus which is very accurately positioned in respect to the magnetic field. The sample tube may be up to one foot in length. Such a system is disclosed in U.S. Pat. Nos. 2,960,649 and 3,681,683 assigned to the assignee of the instant application.

PRIOR ART

Due to the spinning of the sample tube containing the sample, the centrifugal forces acting on the liquid cause the liquid to creep up the wall of the tube, an effect known as vortexing. This effect can result in less than the maximum amount of the sample liquid being positioned in the observing portion of the magnetic field thereby resulting in lower signal and reduced sensitivity. In the prior apparatus this problem was overcome by a number of techniques. Overfilling of the sample tube is a frequent technique which raises the vortex to an area above the zone of observation. This solution is undesirable when sample conservation is important especially so in the larger sample tubes now being used on the order of 12-30mm in diameter. Another approach to this problem has been to fix a solid plug of inert material in the sample tube at the upper surface of the sample. Due to the density of these prior art plugs, to maintain the relative position of the plugs and to restrict vortexing of the sample during spinning, it is necessary to preclude sinking of the plug to the bottom of the sample tube. This has been accomplished by fastening the plug to the tube, or by suspending the plug from above. These solutions have not been entirely satisfactory either. Friction fitting plugs of appropriate materials cannot be made which will work in all sample tubes for which they are designed because the tolerances on the inside diameter of the sample tubes is generally greater than the dimensions allowed to permit a proper friction fit. String supports and side wall restrictions are also unsatisfactory in those situations where the sample temperature changes significantly during an experiment. Additionally the side wall restriction technique does not permit convenient modifications in the amount of sample liquid in the tube.

SUMMARY OF THE INVENTION

An object of this invention is to provide an improved means for restraining vortexing in a spinning NMR sample tube. The further object is to provide a vortex restraining device which accomodates thermal expansions and operates over varying wide temperature ranges and desired sample volumes.

A feature of the invention is to provide a vortex restraining plug which floats partially submerged in the sample and which is conveniently removable. A still further feature of the invention is a plug having a slot in the side wall to permit rapid escape of air in the tube thereby facilitating escape of trapped air and quick insertion of the plug.

DESCRIPTION OF THE PREFERRED EMBODIMENT

We have provided an improved vortex plug which overcomes the disadvantages of the prior art by providing an inert plug that floats in the sample liquid without friction constraints with the tube side wall or external suspension members.

Figure 1:
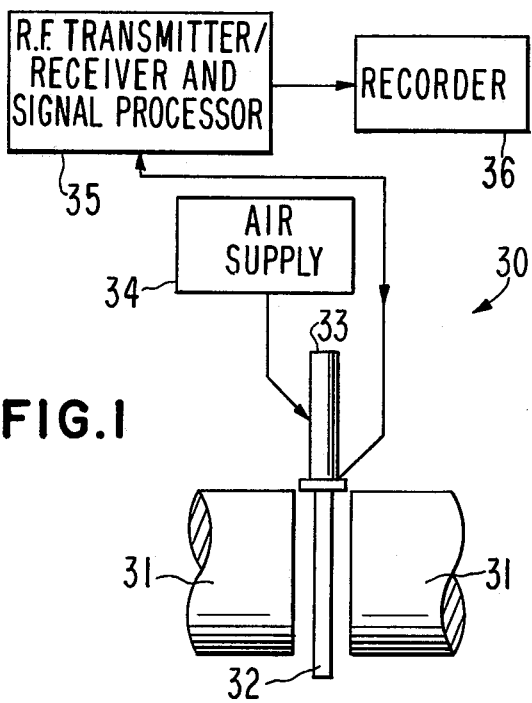
FIG. 1 is a block diagram representation of a system including a spinner apparatus.

With reference to FIG. 1 an NMR spectrometer 30 is shown in block diagram form which includes a high field magnet 31 with an air gap into which a probe 32 is located. Mounted to the top of the probe is a spinner assembly 33 which receives a sample tube, not shown. The spinner assembly 33 supports and spins the sample tube in the magnetic field. An air supply 34 is connected to the spinner. The radio frequency transmitter/receiver and signal processor 35 is connected to the probe 32 which includes coils (not shown) for exciting and detecting resonance spectra of the sample in the sample tube. Recorder 36 provides the user an output indication of the spectrum of the sample being examined.

Figure 2:
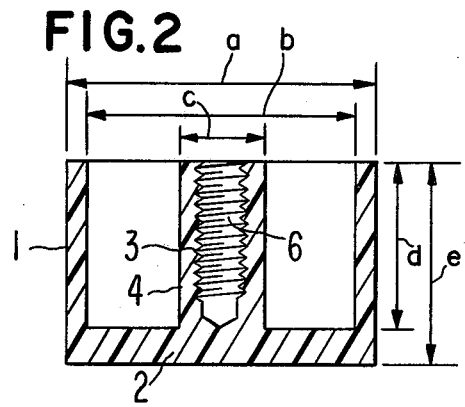
FIG. 2 is a side view of the preferred embodiment of a vortex plug.

One preferred embodiment of our improved plug with reference to FIG. 2 is a cylindrically shaped boat of polyfluorocarbon such as Teflon, or other inert material, designed to float partially submerged in the sample liquid. The boat is made from a right cylindrical section from a bar of Teflon, having an outer cylindrical wall 1 connected to a base 2. A central cylindrical portion 4 attached to base 2 extends from the base 2 in the same directionas the walls 1. Within this central portion is a bore 3 having threads 6 therein. On the external surface of wall 1, a notch 5 is placed which extends the full heighth of the wall.

Figure 5:
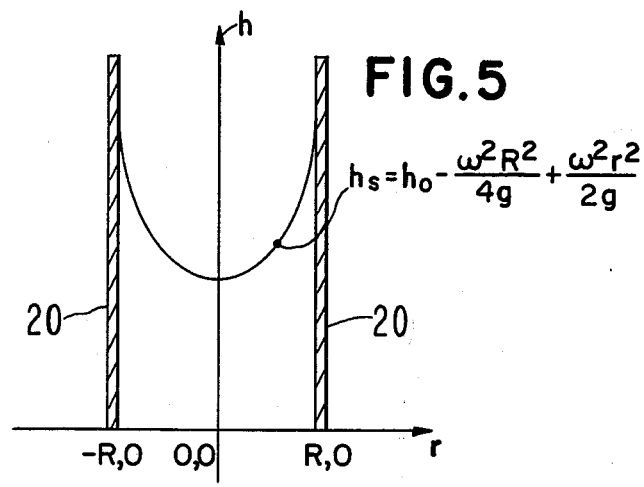
FIG. 5 is a diagram of a vertically unrestrained spinning liquid in a sample tube.
Figure 4:
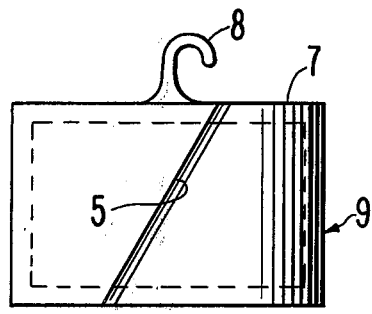
FIG. 4 is a side view of an alternative embodiment of a vortex plug.
Figure 6:
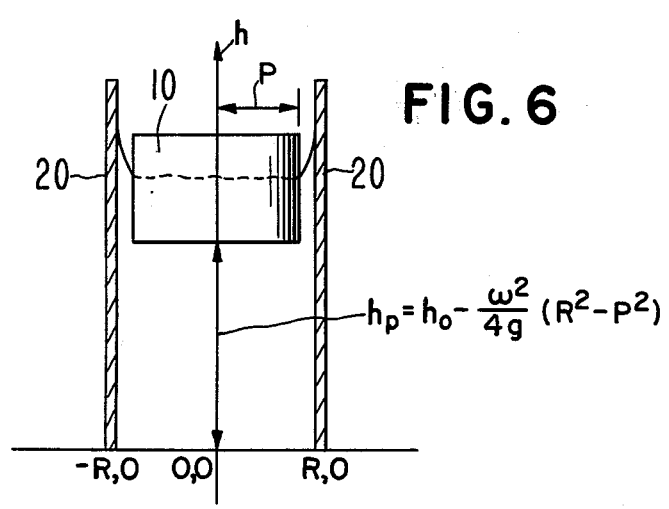
FIG. 6 is a diagram of a spinning liquid in a sample tube restrained by a floating vortex plug.

An extension of the above embodiment with reference to FIG. 4 includes a hollowed out body such as a cylinder of glass. The threaded center cylindrical portions of the previous embodiment of FIG. 2 are replaced by an external hook 8 which can also be conveniently made of glass or other easily formed materials. The plug 9 need not be of hollow construction if the material of which it is constructed is sufficiently bouyant to permit floatation on the desired liquid. The top cover 7 on the hollow boat type plug avoids the occurrence of accidental accumulation or splashing of a liquid into the boat which will cause changes in the displacement volume of the plug. Although the physical embodiments of the improved vortex plugs of our invention are reasonably simple, the principle governing the restriction they effect on the spinning liquid in the sample tube requires an understanding of the behavior of constrained and unconstrained fluid systems. With reference to FIG. 5 assuming a liquid constrained within walls 20 at Radius R and disregarding surface tension effects, the forces acting on any point in the sample are gravity, acting along the vertical axis $h$, and centrifugal forces $\omega^2 r$ acting along the radius.

The potential energy of each point can be represented by the work done to move a particle to a position in the sample from reference point 0,0 against the force fields acting therein.

$$PE = \int_0^h gdh - \int_0^r \omega^2 rdr = gh - \frac{\omega^2 r^2}{2} \quad (1)$$

For a liquid which is unconstrained along the vertical axis in a tube spinning at a constant velocity, $\omega$ the surface of the liquid, in steady state, is a constant potential energy surface. Therefore, $$gh - \frac{\omega^2 r^2}{2} = C \quad (2)$$

and $$h_s = \frac{C}{g} + \frac{\omega^2 r^2}{2g} \quad (3)$$

where $h_s$ is the vertical position of a particle on the surface at any given radius $r$, Since the volume of the liquid sample is independent of spin rate, $$V = \int_0^R h_o 2\pi rdr = \int_0^R h_s 2\pi rdr \quad (4)$$

where $h_o$ is the height of the liquid surface when $\omega$ equals zero.

Integrating $$h_o \pi R^2 = \frac{\pi R^2 C}{g} + \frac{\omega^2 \pi R^4}{4g} \quad (5)$$

and $$\frac{C}{g} = h_o - \frac{\omega^2 R^2}{4g} \quad (6)$$

Substituting equation (6) into equation (3) provides the equation describing the vortex in an unrestrained liquid in a spinning tube as follows:

$$h_s = h_o - \frac{\omega^2 R^2}{4g} + \frac{\omega^2 r^2}{2g} \quad (7)$$

The effect of the insertion of a buoyant object on the surface of the liquid in the spinning tube is to apply a constraint along the vertical axis over the extent to which the body extends in the radial direction.

The position of the plug, $h_p$, in the spinning sample tube will depend on the various forces acting on the plug. The effect of the plug's weight on its position and the equal but opposite buoyant force created when the object is placed in the liquid are not dependent upon the spin rate of the sample tube. Accordingly, we may ignore the effect of the weight of the plug and consider the forces acting on a weightless vortex-plug of radius P floating on the surface of the liquid in a spinning sample tube. Neglecting the plug weight, the forces acting on the plug are due to the atmospheric pressure acting down on the top of the plug and to the pressure of the liquid on the bottom of the plug. When the plug is at its equilibrium height in the tube, these forces will be equal. The pressure of the liquid on the bottom of the weightless plug arises from the centrifugal forces and causes a pressure gradient along the radius of the bottom of the plug. This pressure, $p$, is a function of radius as follows:

$$p = P_r + \int_0^r d\omega^2 rdr = P_r + \frac{1}{2} d\omega^2 r^2 \quad (8)$$

where $P_r$ is the reference pressure at the center of the bottom surface of the plug and $d$ is the density of the liquid.

The reference pressure can be determined relative to atmospheric pressure $P_A$, $$P_r = P_A - (h_p - h_c) dg \quad (9)$$

where $h_c$ is the height of the surface of the spinning liquid at the center of the tube in the absence of the vortex plug.

At all points on the unconstrained vortex, the pressure at the liquid surface is atmospheric. Hence at the point at the center where the height is $h_c$, the pressure is also atmospheric.

The integral of the pressures acting on the top and bottom of the plug can be equated at equilibrium:

$$F\uparrow = \int_0^P p 2\pi rdr \quad (10)$$

$$F\downarrow = \int_0^P P_A 2\pi rdr \quad (11)$$

$$F\downarrow = F\uparrow \quad (12)$$

Since $$P_A \pi P^2 = \int_0^P (P_r + \frac{d\omega^2 r^2}{2}) 2\pi rdr = P_r \pi P^2 + \frac{d\omega^2 \pi P^4}{4} \quad (13)$$

substituting for $P_r$ from equation (9), we obtain $$h_p = h_c + \frac{\omega^2 P^2}{4g} \quad (14)$$

An expression for $h_c$ may be obtained by solving equation (7) for $h_s$ when $r$ is zero.

$$h_c = h_s \text{ When } r = 0 \quad (15)$$

Therefore, $$h_c = h_o - \frac{\omega^2 R^2}{4g} \quad (16)$$

substituting into equation (14) we obtain $$h_p = h_o - \frac{\omega^2}{4g} (R^2 - P^2) \quad (17)$$

Equation (17) shows the position of the floating plug, $h_p$, as a function of the spin rate, $\omega$, and the radii of the sample tube R and vortex plug P.

With respect to equation (17) it is seen for all values of P less than R that the spinning height of the vortex plug $h_p$, is lower than the non-spinning free-floating height $h_o$.

To conserve the maximum sample in the region of observation in the sample tube, equation (17) indicates that P, the plug radius should be made as close to the tube radius as possible. The buoyancy of the plug should be maximized such that $h_p$ is as close to $h_o$ as possible.

Quantitatively, the advantage of the floating plug of this invention can be seen from equations (7) and (17). With reference to an 18 mm diameter sample tube having an inside radius R = 0.327 inch, a plug radius P = 0.324 inch, a spin rate of 20 rev/sec, it can be shown that in the absence of a vortex plug $h_c$ will be 1.1 inch below $h_o$. This difference in vortex position would require an additional overfilling of the tube by 7 ml of solution to preclude the vortex from impinging on the active volume of the sample tube. Similarly, the use of a plug having a slip fit of 6 mils (standard RC8) would require the addition of 0.1 ml of solution to compensate for the lost volume in the active area of the sample tube.

Figure 3:
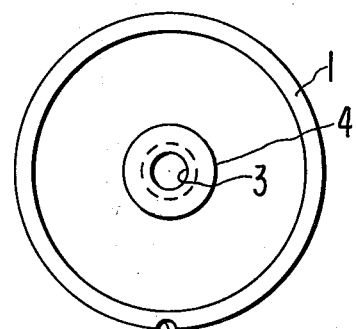
FIG. 3 is a top view of the vortex plug of FIG. 2.

With further reference to FIG. 2 and FIG. 3, the described embodiment for an 18 mm test tube is one in which $a = 0.647, b = 0.595, c = 0.173, d = 0.700$ and $e = 0.750$, all dimensions in inches.

The embodiment of FIGS. 2 and 3 permit easy and quick installation and removal from the sample tube due to the exhaust function of the air passage 5 in its side wall 1 which permits the escape of air during installation and ingress of air during removal. The threaded center portion allows for removal with a threaded rod which can be inserted into the very long sample tube enabling removal of the plug.

The hollowed out boatlike feature of the preferred embodiment of FIGS. 2 and 3 enables the adjustment of the buoyancy of the plug to accomodate inert material having any density and assuring that the plug will float in the sample with some portion of its volume to above the fluid level.

Normally used solvents in NMR include $C_6H_6$, $CHCl_3$, $CCl_4$ $(CH_3)_2 CO$, DMSO, and their deuterated analogs. The specific gravity of these solvents varies from 0.78 to 1.6. The material from which the plug is selected must be inert both to these solvents and to the sample being examined so as not to interfere with the spectrum of the sample. Glass, ceramics, Teflon and plastics are the preferred materials. In view of the fact that Teflon includes fluorine, a plug made of Teflon may not be suitable in all cases when the fluorine spectrum is being examined. Similarly, vortex plugs made from hydrogen containing plastics should not be used when the proton spectrum of a sample is being examined. Materials including iron should generally be excluded since they would not permit the plug to spin in the strong magnetic field and would induce severe turbulence in the spinning sample as well as distorting the homogeneity of the magnetic field.

What is claimed is:

1. Method for conserving sample materials necessary for high resolution NMR spectroscopy comprising the steps of:
   inserting a liquid including a sample for analysis in a substantially right, circular cylindrically shaped NMR sample tube;
   inserting into said sample tube an inert body floatable on said liquid, said body having a substantially circular cross-section of less diameter than said tube;
   inserting said tube including said liquid and floating body into an NMR spinner apparatus;
   spinning said tube at high speed in a high magnetic field, whereby said body restricts the formation of a vortex on the surface of said liquid in said tube.

2. A method of using a freely floating body having a circular cross-section of lesser diameter than an NMR sample tube configured to float in the liquid in said tube to restrict the height of a vortex of a liquid sample in a spinning NMR sample tube comprising the steps of:
   inserting said body into said sample tube with said sample liquid and spinning said sample tube.

3. Spinning sample apparatus comprising:
   a sample tube for receiving a sample liquid
   means for spinning said sample tube at high speeds about the axis of said tube,
   means in said tube for floating on said liquid to impose a vertical constraint on the formation of a vortex in said liquid when the tube is spinning.

4. An improved NMR vortex restraining plug for an NMR spinning sample tube comprising:
   a body of inert material, said body having a circular cross section and an outside diameter less than 30 mm, said body being configured to float on a liquid having a specific gravity between 0.78 and 1.6.

5. The plug of claim 4 wherein said body has a hollowed out interior cavity.

6. The plug of claim 4 wherein said body includes a top, a bottom and side walls having at least one air passage therein which air passage extends from said top to said bottom of said body.

7. The plug of claim 6 including means accessible on said top surface for attaching a removal device.

8. The plug of claim 6 wherein said body is made of glass.

9. The plug of claim 6 wherein said body is made from polyfluorocarbon.

10. The plug of claim 6 wherein said body is made of materials selected from the group consisting of glass, polyfluorocarbon, or plastics.

* * * * *

UNITED STATES PATENT AND TRADEMARK OFFICE
CERTIFICATE OF CORRECTION

PATENT NO. : 4,077,002
DATED : 02/28/78
INVENTOR(S) : Erwine et al

It is certified that error appears in the above-identified patent and that said Letters Patent are hereby corrected as shown below:

Col. 2, line 44: "directionas" should be -- direction as -- .
Col. 3, Eqs. 1 and 4: "$\int$" (integral sign - both occurrences) omitted.
Col. 4, Eqs. 8, 10, 11 and 13: "$\int$" (integral sign) omitted.
Col. 6, line 12: "less" should be -- lesser -- .
Col. 6, line 48: "plugof" should be -- plug of -- .

Signed and Sealed this

Twenty-sixth Day of June 1979

[SEAL]

Attest:

RUTH C. MASON
Attesting Officer

DONALD W. BANNER
Commissioner of Patents and Trademarks